United States Patent
Hargreaves

(10) Patent No.: US 10,816,582 B2
(45) Date of Patent: Oct. 27, 2020

(54) SIGMA-DELTA CONFIGURATIONS FOR CAPACITANCE SENSING

(71) Applicant: Synaptics Incorporated, San Jose, CA (US)

(72) Inventor: Kirk Hargreaves, Sunnyvale, CA (US)

(73) Assignee: Synaptics Incorporated, San Jose, CA (US)

( * ) Notice: Subject to any disclaimer, the term of this patent is extended or adjusted under 35 U.S.C. 154(b) by 116 days.

(21) Appl. No.: 16/178,827

(22) Filed: Nov. 2, 2018

(65) Prior Publication Data

US 2020/0141989 A1 May 7, 2020

(51) Int. Cl.
*G01R 27/26* (2006.01)
*G06F 3/044* (2006.01)
*H03K 17/96* (2006.01)
*H03K 17/955* (2006.01)
*G06F 3/038* (2013.01)

(52) U.S. Cl.
CPC ....... *G01R 27/2605* (2013.01); *G06F 3/0383* (2013.01); *G06F 3/044* (2013.01); *H03K 17/955* (2013.01); *H03K 17/962* (2013.01)

(58) Field of Classification Search
CPC ........ G06F 3/044; G06F 3/045; G06F 3/0383; G01R 27/2605; G01D 5/24; G01D 5/2415; G01D 5/2412; G01D 5/2417
See application file for complete search history.

(56) References Cited

U.S. PATENT DOCUMENTS

| | | | | |
|---|---|---|---|---|
| 7,301,350 B2* | 11/2007 | Hargreaves | ........ | G01R 27/2605 324/678 |
| 8,866,500 B2* | 10/2014 | Kremin | ............. | H03K 17/9622 324/686 |
| 9,639,226 B2* | 5/2017 | Gradinariu | ........... | H03K 17/955 |
| 2014/0176482 A1* | 6/2014 | Wei | .......................... | G06F 3/044 345/174 |
| 2016/0140376 A1* | 5/2016 | Kremin | ................ | G06K 9/0002 382/124 |
| 2018/0129344 A1* | 5/2018 | Hargreaves | ........... | G06F 3/0416 |
| 2019/0227669 A1* | 7/2019 | Maharyta | ................ | G06F 3/044 |

* cited by examiner

*Primary Examiner* — Thang X Le
(74) *Attorney, Agent, or Firm* — Ferguson Braswell Fraser Kubasta PC

(57) ABSTRACT

An input device includes a clocked comparator configured to actively drive a capacitive sensor electrode at a signal input of the clocked comparator with a first periodic reference voltage, and provide a digital representation of a sensing current resulting from driving the capacitive sensor electrode with the first periodic reference signal. The clocked comparator produces the digital representation of the sensing current based on a comparison of the signal input of the clocked generator with the first periodic reference signal. A feedback path provides negative feedback of the digital representation of the sensing current to the signal input of the clocked comparator. The input device further includes a demodulator configured to demodulate the digital representation of the sensing current using the first periodic reference signal to obtain a first digital measurement.

20 Claims, 8 Drawing Sheets

SIGMA-DELTA CONFIGURATIONS FOR CAPACITANCE SENSING

TECHNICAL FIELD

The described embodiments relate generally to electronic devices, and more specifically, to proximity sensor devices that determine (e.g., measure, estimate, etc.) both the in-phase component and quadrature component of interference at one or more frequencies.

BACKGROUND

Input devices including proximity sensor devices such as touchpads or touch sensor devices, are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones). Proximity sensor devices may also be used to detect finger, styli, or pens.

An analog signal obtained from a sensing electrode of a proximity sensor device may need to be converted to a digital signal for further processing.

SUMMARY

In general, one or more embodiments relate to an input device. The input device comprises a clocked comparator configured to: actively drive a capacitive sensor electrode at a signal input of the clocked comparator with a first periodic reference voltage; and provide a digital representation of a sensing current resulting from driving the capacitive sensor electrode with the first periodic reference signal, wherein the clocked comparator produces the digital representation of the sensing current based on a comparison of the signal input of the clocked generator with the first periodic reference signal, and wherein a feedback path provides negative feedback of the digital representation of the sensing current to the signal input of the clocked comparator. The input device further comprises a demodulator configured to demodulate the digital representation of the sensing current using the first periodic reference signal to obtain a first digital measurement.

In general, one or more embodiments relate to an input device. The input device comprises: a first active integrator and an analog-to-digital (A/D) converter in series and configured to: actively drive a capacitive sensor electrode at a signal input of the active integrator with a periodic reference signal; and provide, at an output of the A/D converter, a digital representation of a sensing current resulting from driving the capacitive sensor electrode with the periodic reference signal, wherein the periodic reference signal is provided to a reference input of the first active integrator, and wherein a feedback path provides negative feedback of the digital representation of the sensing current to the signal input of the active integrator. The input device further comprises a demodulator configured to demodulate the digital representation of the sensing current using the periodic reference signal to obtain a digital measurement.

In general, one or more embodiments relate to a method for operating an input device. The method comprises: obtaining a periodic reference signal; driving a capacitive sensor electrode using the periodic reference signal by a sigma-delta circuit, resulting in a sensing current; obtaining a digital representation of the sensing current, by the sigma-delta circuit; and demodulating the digital representation of the sensing current to obtain a digital measurement.

Other aspects of the embodiments will be apparent from the following description and the appended claims.

BRIEF DESCRIPTION OF DRAWINGS

The present embodiments are illustrated by way of example and are not intended to be limited by the figures of the accompanying drawings.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present invention provide input devices and methods that may facilitate improved usability along with various other benefits.

Figure 1:
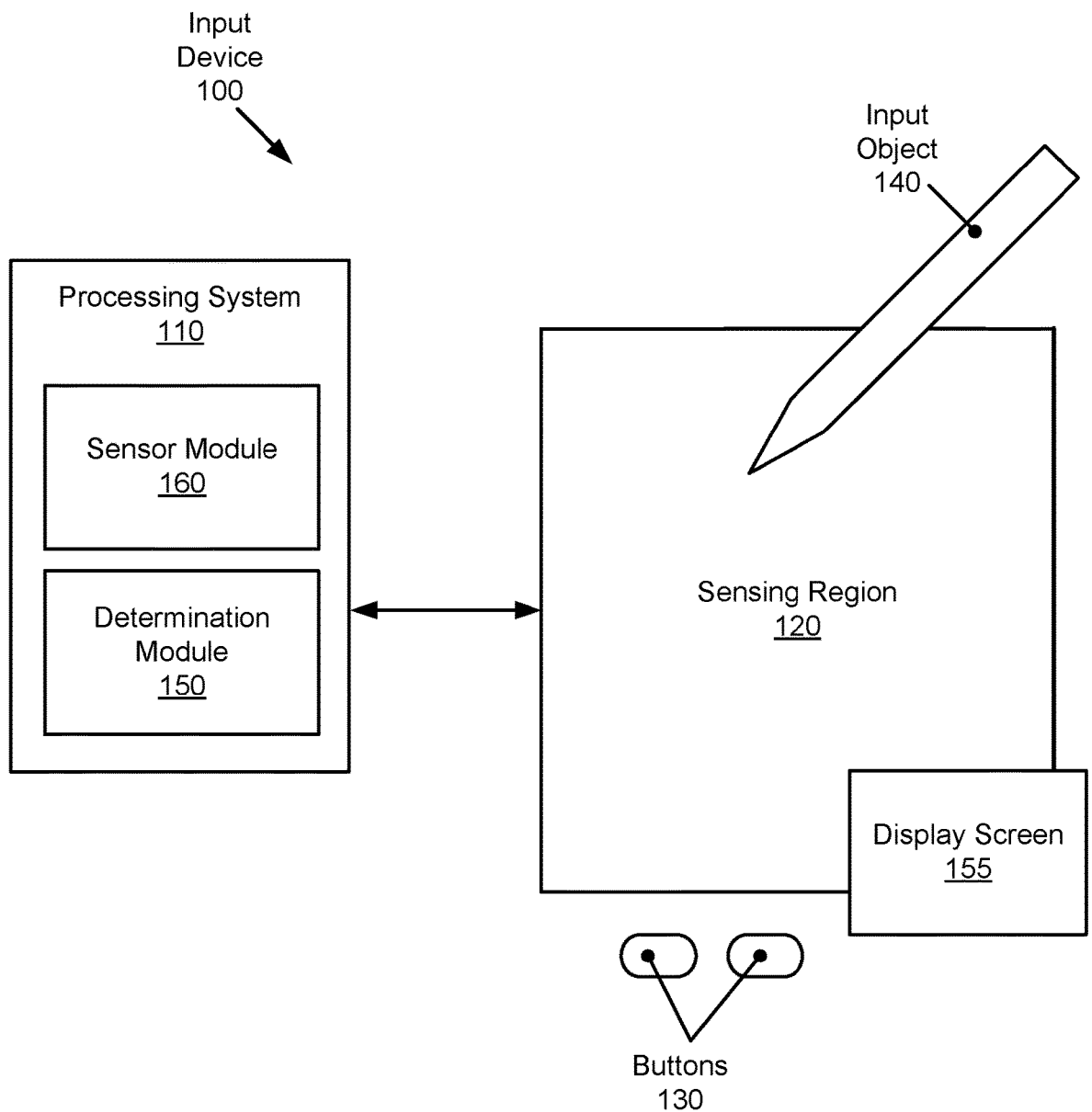
FIG. 1 shows a block diagram of an input device in accordance with one or more embodiments.

Turning now to the figures, FIG. 1 is a block diagram of an exemplary input device (100) within which the present embodiments may be implemented. The input device (100) includes a processing system (110) and a sensing region (120). The input device (100) may be configured to provide input to an electronic system (not shown for simplicity). Examples of electronic systems (or electronic devices) may include personal computers (e.g., desktop computers, laptop computers, tablet computers, netbook computers, tablets, web browsers, e-book readers, and personal digital assistants (PDAs)), composite input devices (e.g., physical keyboards, joysticks, or key switches), data input devices (e.g., remote controls and mice), data output devices (e.g., display screens and printers), remote terminals, kiosks, and video game machines (e.g., video game consoles, portable gaming devices, and the like), communication devices (e.g., cellular phones, such as smart phones), and media devices (e.g., recorders, editors, and players such as televisions, set-top boxes, music players, digital photo frames, and digital cameras). The electronic system can be a host or a slave to the input device.

The input device (100) may be implemented as a physical part of the corresponding electronic system, or may be physically separate from the electronic system. Further, portions of the input device (100) may be part of the electronic system. For example, all or part of the determination module (150) may be implemented in the device driver of the electronic system. The input device (100) may be coupled to and communicate with components of the electronic system using various wired or wireless technologies, such as buses and networks. Example technologies may include Inter-Integrated Circuit ($I^2C$), Serial Peripheral Interface (SPI), PS/2, Universal Serial Bus (USB), Bluetooth®, Infrared Data Association (IrDA), and various radio frequency (RF) communication protocols defined by the IEEE 802.11 or other standards.

In the example of FIG. 1, the input device (100) may correspond to a proximity sensor device (e.g., a "touchpad" or a "touch sensor device") configured to sense input provided by one or more input objects (140) in a sensing region (120). Example input objects include styli, active pen, fingers, fingertips, and the like. The sensing region (120) may encompass any space above, around, in, and/or proximate to the input device (100) in which the input device (100) is able to detect user input (e.g., provided by one or more input objects 140)). The size, shape, and location of particular sensing region (120) (e.g., relative to the electronic system) may vary depending on actual implementations.

In some embodiments, the sensing region (120) extends from a surface of the input device (100) in one or more directions in space, for example, until a signal-to-noise ratio (SNR) of the sensors falls below a threshold suitable for object detection. For example, the distance to which this sensing region (120) extends in a particular direction may be on the order of less than a millimeter, millimeters, centimeters, or more, and may vary with the type of sensing technology used and/or the accuracy desired. In some embodiments, the sensing region (120) may detect inputs involving no physical contact with any surfaces of the input device (100), contact with an input surface (e.g. a touch surface) of the input device (100), contact with an input surface (e.g., a touch surface and/or screen) of the input device (100), contact with an input surface of the input device (100) coupled with some amount of applied force or pressure, and/or a combination thereof.

In various embodiments, input surfaces may be provided by, and/or projected on, one or more surfaces of housing of the input device (100) (e.g., as an image). For example, the sensing region (120) may have a rectangular shape when projected onto an input surface of the input device (100). In some aspects, inputs may be provided through images spanning one, two, three, or higher dimensional spaces in the sensing region (120). In some aspects, inputs may be provided through projections along particular axes or planes in the sensing region (120). Still further, in some aspects, inputs may be provided through a combination of images and projections in the sensing region (120).

The input device (100) may utilize various combination of sensor components and sensing technologies to detect user input in the sensing region (120). Example sensing technologies may include capacitive, elastic, resistive, inductive, magnetic, acoustic, ultrasonic, radio frequency (RF) waves, and/or optical sensing technologies. The input device (100) may include one or more sensing elements configured to implement the various sensing technologies.

In some embodiments, the input device (100) may utilize resistive sensing technologies to detect user inputs. For example, the sensing region (120) may be formed by a flexible and conductive first layer separated by one or more spacer elements from a conductive second layer. The sensing region (120) may detect user input by creating one or more voltage gradients across the layers when the first layer is brought into contact with the second layer. More specifically, pressing the flexible first layer may deflect it sufficiently to create electrical contact between the layers, resulting in voltage outputs reflective of the point(s) of contact between the layers. These voltage outputs may be used to determine positional information (e.g., indicating a position, in the sensing region 120) about the detected inputs.

In other embodiments, the input device (100) may utilize inductive sensing technologies to detect using inputs. For example, the sensing region (120) may include one or more sensing elements configured to pick up loop currents induced by a resonating coil or pair of coils. The input device (100) may then detect user inputs using a combination of the magnitude, phase, and frequency of the currents. The characteristics of the loop currents may be used to determine positional information about the detected inputs.

In yet other implementations, the input device system (100) may utilize radio frequency (RF) technologies to detect user inputs. For example, the sensing region (120) may include one or more sensing elements configured to receive/intercept/detect RF waves.

In some optical implementations of the input device system (100), one or more sensing elements are cameras (e.g., red-green-blue (RGB) cameras, infrared (IR) cameras, ultra violet (UV) cameras, etc.) that generate images of the sensing region and thus any input objects in the sensing region.

In some capacitive implementations of the input device system (100), voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object proximate to the sensor electrodes alters the electric field associated with the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "trans capacitance") sensing methods based on changes in the capacitive coupling between sensor electrodes. In various embodiments, an input object proximate to the sensor electrodes alters the electric field between the sensor electrodes, thus changing the measured capacitive coupling. In one implementation, a mutual capacitance sensing method operates by detecting the capacitive coupling between one or more transmitter sensor electrodes (also "transmitter electrodes" or "transmitter") and one or more receiver sensor electrodes (also "receiver electrodes" or "receiver"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. The reference voltage may be a substantially constant voltage and in various embodiments; the reference voltage may be system ground. In some embodiments, transmitter sensor electrodes may both be modulated. The transmitter electrodes are modulated relative to the receiver electrodes to transmit transmitter signals and to facilitate receipt of resulting signals. A resulting signal may include effect(s) corresponding to one or more transmitter signals, and/or to one or more sources of environmental interference (e.g. other electromagnetic signals). The effect(s) may be the transmitter signal, a change in the transmitter signal caused by one or more input objects and/or environmental interference, or other such effects. Sensor electrodes may be dedicated transmitters or receivers, or may be configured to both transmit and receive. Measurements acquired using mutual capacitance sensing methods may be referred to as mutual capacitance measurements.

Further, the sensor electrodes may be of varying shapes and/or sizes. The same shapes and/or sizes of sensor electrodes may or may not be in the same groups. For example, in some embodiments, receiver electrodes may be of the same shapes and/or sizes while, in other embodiments, receiver electrodes may be varying shapes and/or sizes.

In FIG. 1, a processing system (110) is shown as part of the input device (100). The processing system (110) is configured to operate the hardware of the input device (100) to detect input in the sensing region (120). The processing system (110) includes parts of or all of one or more integrated circuits (ICs) and/or other circuitry components. For example, a processing system for a mutual capacitance sensor device may include transmitter circuitry configured to transmit signals with transmitter sensor electrodes, and/or receiver circuitry configured to receive signals with receiver sensor electrodes. Further, a processing system for an absolute capacitance sensor device may include driver circuitry configured to drive absolute capacitance signals onto sensor electrodes, and/or receiver circuitry configured to receive signals with those sensor electrodes. Further still, a processing system for an optical sensor (e.g., cameras) device may include circuitry configured to obtain and process images of the sensing region. In one or more embodiments, a processing system for a combined capacitance sensor device and optical sensor device may include any combination of the above described circuitry. In some embodiments, the processing system (110) also includes electronically-readable instructions, such as firmware code, software code, and/or the like.

In some embodiments, components composing the processing system (110) are located together, such as near sensing element(s) of the input device (100). In other embodiments, components of processing system (110) are physically separate with one or more components close to the sensing element(s) of the input device (100), and one or more components elsewhere. For example, the input device (100) may be a peripheral coupled to a computing device, and the processing system (110) may include software configured to run on a central processing unit of the computing device and one or more ICs (perhaps with associated firmware) separate from the central processing unit. As another example, the input device (100) may be physically integrated in a mobile device, and the processing system (110) may include circuits and firmware that are part of a main processor of the mobile device. In some embodiments, the processing system (110) is dedicated to implementing the input device (100). In other embodiments, the processing system (110) also performs other functions, such as operating display screens, driving haptic actuators, etc.

The processing system (110) may be implemented as a set of modules that handle different functions of the processing system (110). Each module may include circuitry that is a part of the processing system (110), firmware, software, or a combination thereof. In various embodiments, different combinations of modules may be used. For example, as shown in FIG. 1, the processing system (110) may include a determination module (150) and a sensor module (160). The determination module (150) may include functionality to determine when at least one input object is in a sensing region, determine signal to noise ratio, determine positional information of an input object, identify a gesture, determine an action to perform based on the gesture, a combination of gestures or other information, and/or perform other operations.

The sensor module (160) may include functionality to drive the sensing elements to transmit transmitter signals and receive the resulting signals. For example, the sensor module (160) may include sensory circuitry that is coupled to the sensing elements. The sensor module (160) may include, for example, a transmitter module and a receiver module. The transmitter module may include transmitter circuitry that is coupled to a transmitting portion of the sensing elements. The receiver module may include receiver circuitry coupled to a receiving portion of the sensing elements and may include functionality to receive the resulting signals. The sensor module (160) may include functionality to obtain images of the sensing region (120) from one or more cameras.

Although FIG. 1 shows a determination module (150) and a sensor module (160), alternative or additional modules may exist in accordance with one or more embodiments. Such alternative or additional modules may correspond to distinct modules or sub-modules than one or more of the modules discussed above. Example alternative or additional modules include hardware operation modules for operating hardware such as sensor electrodes, cameras, and/or display screens, data processing modules for processing data such as sensor signals and positional information, reporting modules for reporting information, and identification modules configured to identify gestures, such as mode changing gestures, and mode changing modules for changing operation modes. Further, the various modules may be combined in separate integrated circuits. For example, a first module may include at least partially within a first integrated circuit and a separate module may include at least partially within a second integrated circuit. Further, portions of a single module may span multiple integrated circuits. In some embodiments, the processing system as a whole may perform the operations of the various modules.

In some embodiments, the processing system (110) responds to user input (or lack of user input) in the sensing region (120) directly by causing one or more actions. Example actions include changing operation modes, as well as graphical user interface (GUI) actions such as cursor movement, selection, menu navigation, and other functions. In some embodiments, the processing system (110) provides information about the input (or lack of input) to some part of the electronic system (e.g. to a central processing system of the electronic system that is separate from the processing system (110), if such a separate central processing system exists). In some embodiments, some part of the electronic system processes information received from the processing system (110) to act on user input, such as to facilitate a full range of actions, including mode changing actions and GUI actions.

For example, in some embodiments, the processing system (110) operates the sensing element(s) of the input device (100) to produce electrical signals indicative of input (or lack of input) in the sensing region (120). The processing system (110) may perform any appropriate amount of processing on the electrical signals in producing the information provided to the electronic system. For example, the processing system (110) may digitize analog electrical signals obtained from the sensor electrodes. As another example, the processing system (110) may perform filtering or other signal conditioning. As yet another example, the processing system (110) may subtract or otherwise account for a baseline, such that the information reflects a difference between the electrical signals and the baseline. As yet further examples, the processing system (110) may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device (100) is implemented with additional input components that are operated by the processing system (110) or by some other processing system. These additional input components may provide redundant functionality for input in the sensing region (120), or some other functionality. FIG. 1 shows buttons (130) near the sensing region (120) that may be used to facilitate selection of items using the input device (100). Other types of additional input components include sliders, balls, wheels, switches, and the like. Conversely, in some embodiments, the input device (100) may be implemented with no other input components.

In some embodiments, the input device (100) includes a touch screen interface, and the sensing region (120) overlaps at least part of an active area of a display screen. For example, the input device (100) may include substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device (100) and the display screen may share physical elements. For example, some embodiments may utilize some of the same electrical components for displaying and sensing. In various embodiments, one or more display electrodes of a display device may be configured for both display updating and input sensing. As another example, the display screen may be operated in part or in total by the processing system (110).

It should be understood that while many embodiments are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media that is readable by the processing system (110)). Additionally, the embodiments of the present invention apply equally regardless of the particular type of medium used to carry out the distribution. For example, software instructions in the form of computer readable program code to perform embodiments of the invention may be stored, in whole or in part, temporarily or permanently, on a non-transitory computer readable storage medium. Examples of non-transitory, electronically readable media include various discs, physical memory, memory, memory sticks, memory cards, memory modules, and or any other computer readable storage medium. Electronically readable media may be based on flash, optical, magnetic, holographic, or any other storage technology.

Although not shown in FIG. 1, the processing system, the input device, and/or the host system may include one or more computer processor(s), associated memory (e.g., random access memory (RAM), cache memory, flash memory, etc.), one or more storage device(s) (e.g., a hard disk, an optical drive such as a compact disk (CD) drive or digital versatile disk (DVD) drive, a flash memory stick, etc.), and numerous other elements and functionalities. The computer processor(s) may be an integrated circuit for processing instructions. For example, the computer processor(s) may be one or more cores, or micro-cores of a processor. Further, one or more elements of one or more embodiments may be located at a remote location and connected to the other elements over a network. Further, embodiments of the invention may be implemented on a distributed system having several nodes, where each portion of the invention may be located on a different node within the distributed system. In one embodiment of the invention, the node corresponds to a distinct computing device. Alternatively, the node may correspond to a computer processor with associated physical memory. The node may alternatively correspond to a computer processor or micro-core of a computer processor with shared memory and/or resources.

Figure 2:
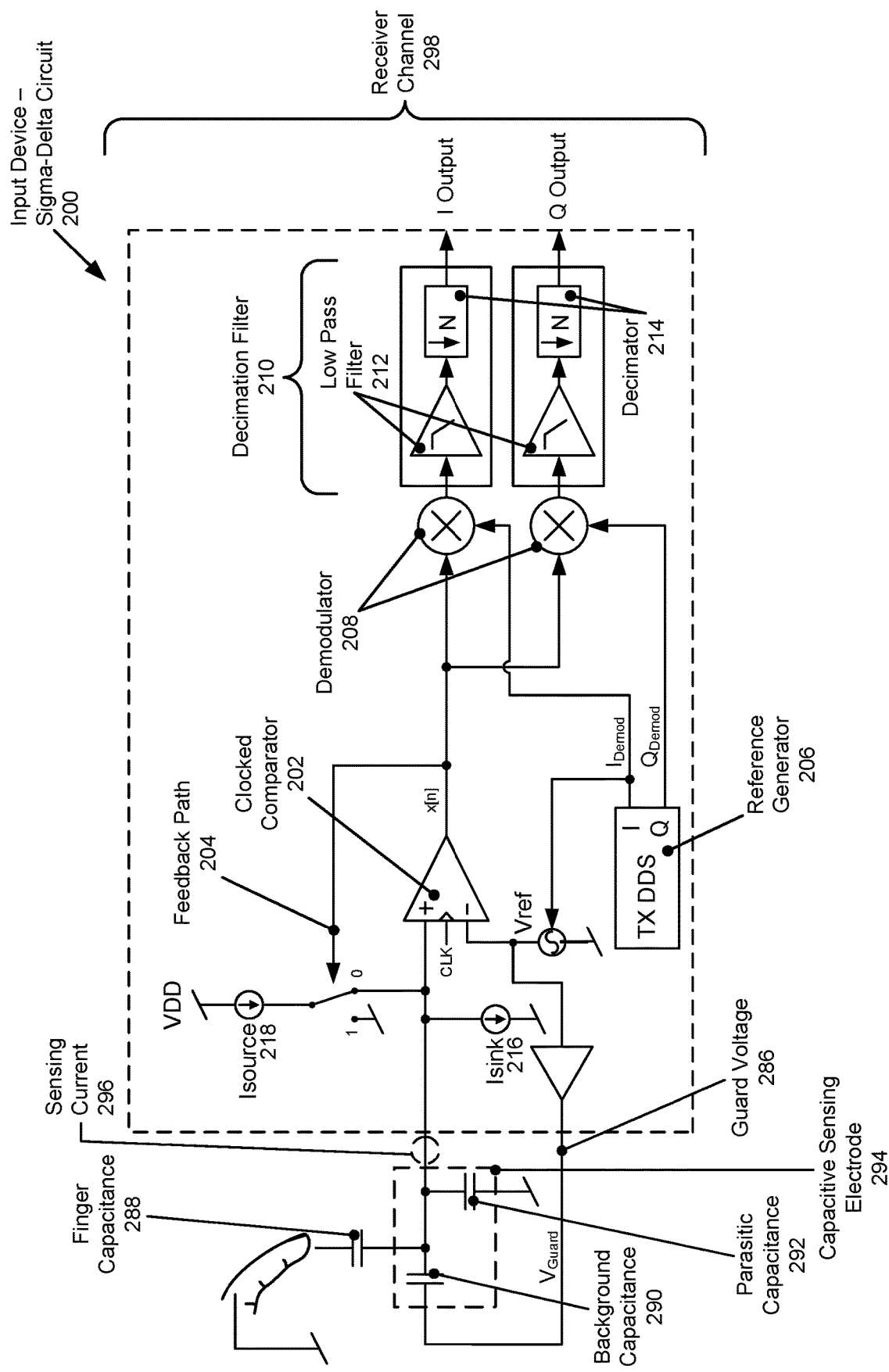
FIG. 2 shows a block diagram of a single-bit sigma-delta configuration for capacitance sensing, in accordance with one or more embodiments.

FIG. 2 shows an input device (200) in accordance with one or more embodiments. The input device (200) may correspond to input device (100), discussed above in reference to FIG. 1. As shown in FIG. 2, the input device (200) may include a sigma-delta circuit, including various peripheral circuit components. In the illustrated embodiment, the input device (200) includes a clocked comparator (202), a feedback path (204), a reference generator (206), two demodulators (208) and two decimation filters (210). Each of these components is subsequently described.

In the exemplary embodiment of FIG. 2, a single receiver channel (298) is illustrated. In the receiver channel (298), the input device (200) may receive a sensing current (296) of a capacitive sensing electrode (294) and may output digital quadrature signals (I, Q), reflecting the sensing current (296). In an input device (100) in accordance with one or more embodiments, many receiver channels (298)

may exist in parallel. Each receiver channel may be dedicated to one capacitive sensing electrode (294).

The capacitive sensor electrode (294), in FIG. 2, includes the finger capacitance (288), guarded background capacitance (290) and the parasitic capacitance (292). The guard voltage $V_{guard}$ (286) drives the background capacitance (290), reducing its effective value. By scaling the guard voltage (286), e.g., using an adjustable amplifier, the parasitic capacitance (292) may be also partially or wholly cancelled. A driven shield, based on Vguard, is optional, i.e., in some embodiments, no guard voltage is present. Those skilled in the art will appreciate that other capacitances may be located at the input of the sigma-delta circuit as well, for example, an interference capacitance (toward actively emitting objects), inductances, and/or resistances. In one or more embodiments of the invention, the parasitic capacitance (292) forms the integrator component of the sigma-delta circuit (200). Other configurations are shown in the subsequent figures.

In one or more embodiments, the signal input of the clocked comparator (202) electrically interfaces with the finger capacitance (288), background capacitance (290) and the parasitic capacitance (292). This electrical interface, in accordance with one or more embodiments, serves dual purposes: (i) the capacitive sensor electrode is actively driven using a subsequently described signal $V_{ref}$; and (ii) the sensing current required to drive the capacitive sensing electrode is quantified to determine the capacitance of the capacitive sensor electrode (294). The driving of the capacitive sensing electrode and the quantification of the capacitance of the sensing electrode may be performed as subsequently described.

The clocked comparator may be provided with a high frequency clock, CLK, which may be in excess of 1 MHz, e.g., 15 MHz or 50 MHz. In one or more embodiments, CLK is selected to oversample the signal input of the clocked comparator. The clocked comparator is further provided with a periodic reference signal or voltage, $V_{ref}$, to which the comparator compares the voltage at the signal input of the comparator. With each clock cycle, a comparison may be made. If the signal input of the comparator is above $V_{ref}$, a HIGH signal is provided at the output of the comparator, and if the signal input of the comparator is below $V_{ref}$, a LOW signal is provided at the output of the comparator. A new output may be generated with each clock cycle, resulting in a series of HIGH/LOW pulses, x[n], at the output of the comparator. The resulting pulse code, x[n], reflects the sensing current at the signal input of the clocked comparator in a digital single-bit format as a pulse code, and information about the capacitance of the capacitive sensor electrode (294) is, therefore, included in x[n]. A digital representation of the sensing current is, thus, obtained.

Using the feedback path (204) the current at the signal input of the clocked comparator (202) is modulated based on x[n], in accordance with one or more embodiments. Specifically, the current sink (216) may draw a current, $I_{sink}$, from the capacitive sensor electrode (294), or from the combination of the capacitive sensor electrode (294) and a current source (218) (providing $I_{source}$), controlled by the state of the clocked comparator (202) output via the feedback path (204). $I_{source}$ may be $2 \times I_{sink}$, thus causing a net current $+/- I_{sink}$ to/from the capacitive sensor electrode (294). While one implementation of a current digital-to-analog converter (IDAC), based on $I_{source}$ and $I_{sink}$, is illustrated, other implementations may be used, without departing from the invention. For example, the above configuration could be reversed to include a switched current sink rather than a switched current source, with $I_{sink}=2 \times I_{source}$. Further, both $I_{source}$ and $I_{sink}$ may be switched, with $I_{sink}=I_{source}$. Alternatively, an invertedly-driven resistor may form the current source in the feedback path. Other more complex circuits including NFET-based switched current sinks, current mirror circuits configured to switch between a current mirror bias and ground, etc., may be used without departing from the invention. In one or more embodiments, the resulting negative feedback loop enforces a voltage at the signal input of the clocked comparator (202) that corresponds to the periodic reference signal, $V_{ref}$. Accordingly, the capacitive sensor electrode (294), being directly electrically connected to the signal input of the clocked comparator, is driven by $V_{ref}$.

The above described operations establish the sigma-delta circuit (200), with the sigma component provided implicitly by the parasitic capacitance (294) operating as an integrator, and the delta component provided by the feedback path (204).

In one or more embodiments, the reference generator (206), a numerically controlled oscillator, generates the periodic reference signal, $V_{ref}$. $V_{ref}$ may be, for example, a sinusoid, a square wave, or any other periodic waveform. The frequency of $V_{ref}$ may be 100 kHz, 200 kHz, or any other frequency significantly below the clock frequency CLK to allow for over sampling. It may be desirable to select a CLK frequency that is at least 100 times higher than the frequency of $V_{ref}$ although smaller ratios may be used. A 50 MHz CLK frequency may be used, for example, for $V_{ref}$ frequencies in a range of 10 kHz to 500 kHz.

In one embodiment, the reference generator (206) is a digital signal generator such as a direct digital synthesizer (DDS). In the embodiment shown in FIG. 2, the reference generator (206) provides quadrature signals (I and Q outputs), although in alternative implementations the Q output may not be included. It may further be desirable for the demodulator signal from the reference generator to have a different phase than the reference signals $V_{ref}$. Accordingly, $V_{ref}$ may be driven by an output of the reference generator (206), separate from the I and Q outputs.

In one or more embodiments, the output x[n] of the clocked comparator (202) is provided to the demodulators (208). In the embodiment shown in FIG. 2, two digital demodulators and low pass filters are used to obtain quadrature output signals. The digital demodulators operating on the digital single-bit signal provided by the clock comparator (202), where the periodic reference demodulation signals Idemod and Qdemod are either negated or not (multiplied by -1 or +1). The demodulators may, thus, frequency shift the capacitance signal from x[n] to obtain demodulated signals that represent the capacitance of the capacitive sensor electrode (294) in the form of digital measurements of the sensing current which is at least partially governed by the capacitance of the capacitive sensor electrode.

Subsequently, in one or more embodiments, the demodulated signals are provided to low pass filters (212), followed by decimators (214) to obtain lower-frequency signals suitable for further processing. In one embodiment, decimation filters (210) are used. A decimation filter may be formed by an FIR filter where each filter tap is applied once and summed. The output signal may have a sampling frequency of, for example, 100 Hz, 1 kHz, 20 kHz, etc. Those skilled in the art, having the benefit of this detailed description, will appreciate that the decimation filter (208) may perform low pass filtering and down-sampling using multiple filter coefficients. In one or more embodiments, a combination of a demodulator, a low pass filter and a decimator may be implemented using a single table or coefficient generator and a multiplier-accumulator.

In one embodiment, the demodulation signal Idemod or Qdemod and low-pass FIR coefficients are multiplied before the demodulator. The demodulator, low-pass filter, and decimator may then be a multiplier and an accumulator. After N cycles, the summed result is the decimated I or Q output and the accumulator is reset for the next conversion. In the case of a one-bit ADC (comparator), the multiplier may be replaced by a negation or not, depending on comparator output. The combined demodulator and filter coefficients may either be calculated on-the-fly or stored in a table. Further, in the case of the one-bit ADC (comparator), the multiplier may be replaced by an addition of the combined demodulator and filter coefficients or not, depending on comparator output.

The combined demodulator and filter coefficients may be shared among multiple channels received simultaneously. Each channel then needs to only implement the ADC, IDAC, and a multiplier-accumulator.

In one or more embodiments, in the implementation of the input device (200), the use of digital components is maximized to reduce the need for analog components. Specifically, for example, the reference generator (206), the demodulators (208) and/or the decimation filters (210) are digital components. This design, in accordance with one or more embodiments, eliminates the need for a separate analog demodulation, filter and ADC chain. Because the circuit is mainly digital, the circuit may be relatively low cost and may require minimal space as a result of the elimination of integration capacitors and/or current conveyors.

Figure 3:
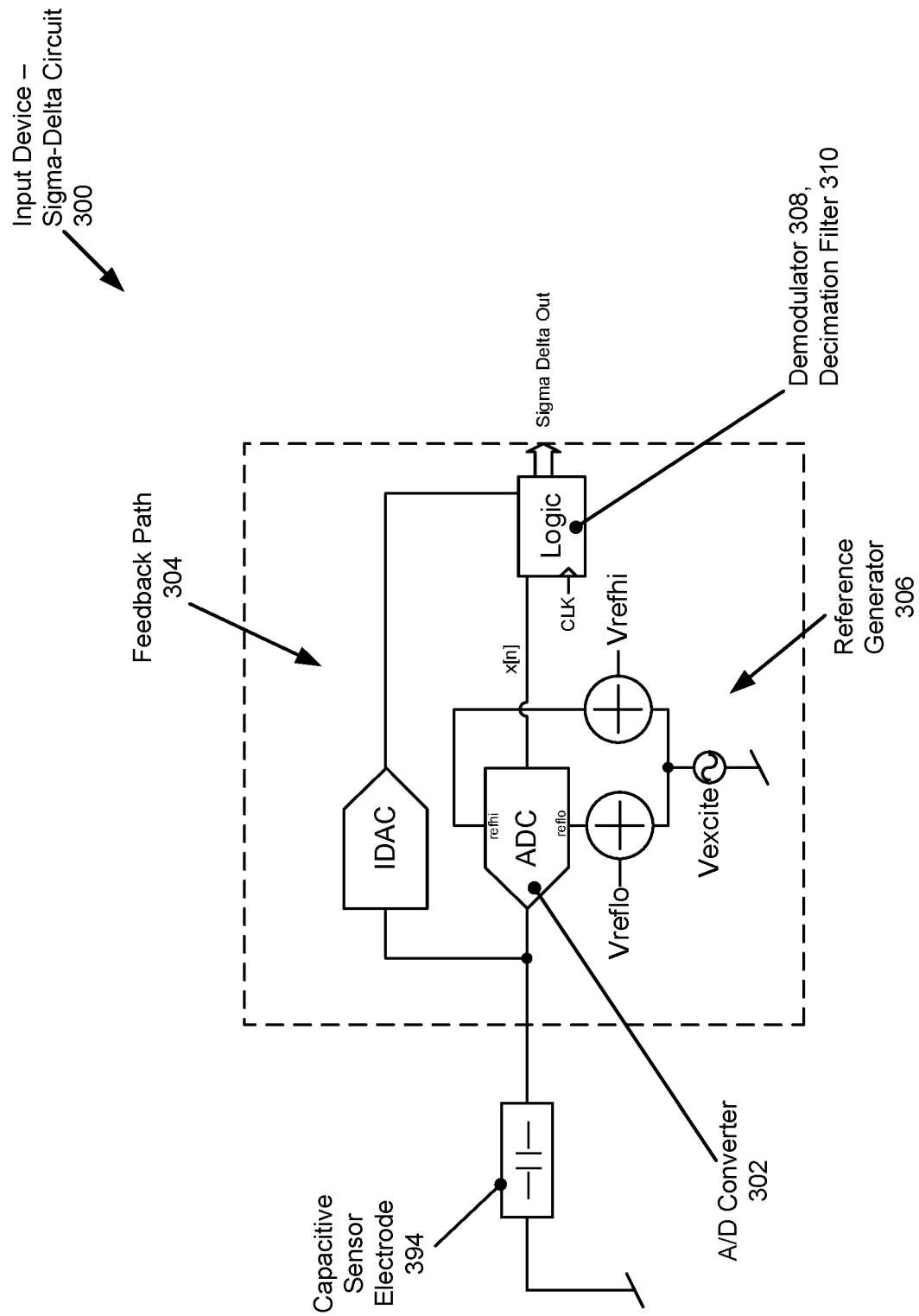
FIG. 3 shows a block diagram of a multi-bit sigma-delta configuration for capacitance sensing, in accordance with one or more embodiments.

Turning to FIG. 3, an input device (300) in accordance with one or more embodiments is shown. The input device (300) may correspond to the input device (100), discussed above in reference to FIG. 1. The representation shown in FIG. 3 may be interpreted as a generalized implementation of the embodiment previously described with reference to FIG. 2. Specifically, unlike in FIG. 2, in the embodiment shown in FIG. 3, x[n] is multi-bit. Accordingly, the comparator (202) (single-bit output) in FIG. 2 is replaced by an A/D converter (302). The A/D converter (302) may have any resolution, e.g., two, three, eight, ten or twelve bits.

Further, the reference generator (306), in accordance with one or more embodiments, provides two periodic reference signals ($V_{reflo}$, $V_{refhi}$) to the A/D converter. The periodic reference signals may be derived from a single reference signal which may be obtained from a reference generator as discussed with reference to FIG. 2. The two periodic reference signals may be obtained by individually adjusting the amplitude for each of the periodic reference signals.

Analogous to the embodiment of FIG. 2, a demodulator (308) and a decimation filter (310) are digitally implemented, in accordance with one or more embodiments. Depending on the implementation, the resulting output signal may or may not be a quadrature signal.

In one or more embodiments, due to the multi-bit quantization, the feedback path (304) is implemented using a multi-bit current output D/A converter rather than a switch as in FIG. 2 (1-bit current output D/A converter), to provide the feedback current that modulates the sensing current obtained from the capacitive sensor electrode (394). The capacitive sensor electrode (394) may include a parasitic capacitance, a background capacitance that may or may not be a result of guarding using a guard voltage, a finger capacitance, an interference capacitance, and/or resistances, as previously discussed with reference to FIG. 2.

The implementation of FIG. 3 may have superior noise characteristics as a result of a reduction of the quantization error, due to the use of multiple rather than a single bit for the quantization.

Figure 4:
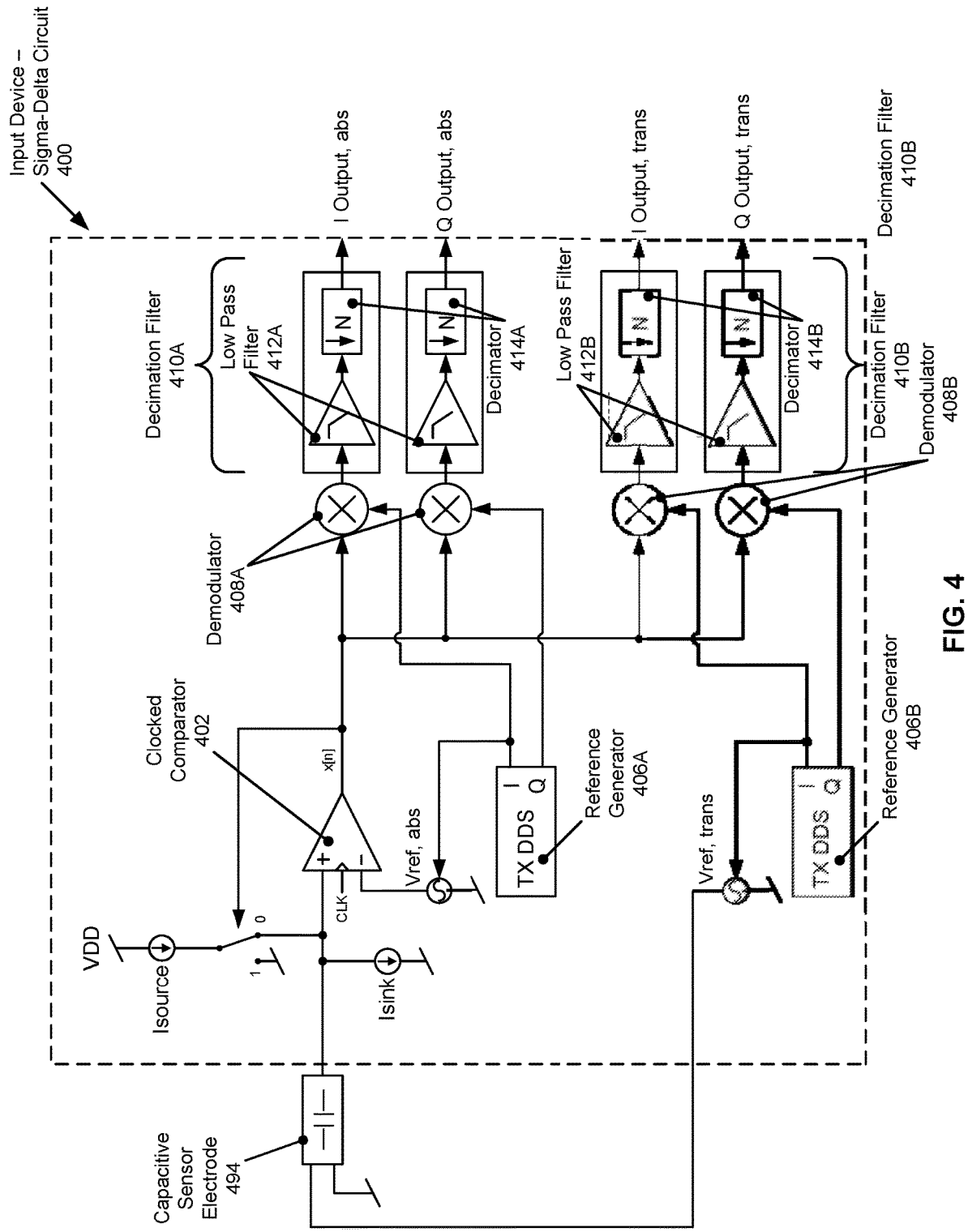
FIG. 4 shows a block diagram of a single-bit sigma-delta configuration for absolute capacitance sensing and transcapacitance sensing, in accordance with one or more embodiments.

Turning to FIG. 4, an input device (400) in accordance with one or more embodiments is shown. The input device (400) may correspond to input device (100), discussed above in reference to FIG. 1. The representation shown in FIG. 4 may be understood as an extended implementation of the embodiment previously described with reference to FIG. 2. Specifically, the embodiment shown in FIG. 4 is configured to simultaneously obtain measurements of absolute capacitance and transcapacitance. The transcapacitance measurement may be provided by additional circuit elements of the input device, as subsequently discussed.

Analogous to the circuit of FIG. 2, the capacitive sensor electrode (494) is electrically coupled to the clocked comparator (402). The capacitive sensor electrode (494) may include a parasitic capacitance, a finger capacitance, a background capacitance that may or may not be a result of guarding using a guard voltage, an interference capacitance, and/or resistances, as previously discussed with reference to FIG. 2. The circuit of FIG. 4 is configured to assess absolute capacitance and transcapacitance, in accordance with one or more embodiments. Accordingly, in the embodiment illustrated in FIG. 4, a capacitance measurement is performed not only toward the ground potential, but also toward the potential of another capacitive sensor electrode.

The absolute capacitance measurement (toward the ground potential) may be obtained as previously described with reference to FIG. 2 (upper half of the sigma-delta circuit in FIG. 4). The transcapacitance measurement may be obtained by modulating the potential of the other capacitive sensor electrode at a frequency different from the frequency used to modulate the voltage of the capacitive sensor electrode (494) (lower half of the sigma-delta circuit in FIG. 4). For example, $V_{ref,\ abs}$ may be 100 kHz and $V_{ref,\ trans}$ may be 200 kHz. FIG. 4 shows two reference generators (406A, 406B), producing $V_{ref,\ abs}$ and $V_{ref,\ trans}$, respectively. A single reference generator that outputs multiple frequencies may alternatively be used.

The input device of FIG. 4, in accordance with one or more embodiments, further includes separate demodulators (408A, 408B), low pass filters (412A, 412B), and decimators (414A, 414B) for the different modulation frequencies. The demodulators, low-pass-filter, and decimators may be implemented as a coefficient generator, a multiplier, and an accumulator. The low pass filters (412A, 412B) and the decimators (414A, 414B) may be implemented as decimation filters (410A, 410B). Pairs of demodulators and low pass filters and decimators or decimation filters may be used if I and Q quadrature signals are desired. Alternatively, if only the I signal is desired, two single demodulators and decimation filters may be used. To reduce the number of circuit components, the same low pass filter coefficient generator may be used for all low pass filters.

To compensate for phase variations in the sensing pathways through the input device or due to the capacitive sensor electrode itself, phases may be individually shifted, prior to the mixing operation of the demodulators. If the same numerically controlled oscillator is used for generation of $V_{ref,\ abs}$ and $V_{ref,\ trans}$, the phase offset may be added prior to the mixing operation for both signals.

The described configuration, thus, enables simultaneous measurement of absolute capacitance and transcapacitance, in accordance with one or more embodiments.

Figure 5:
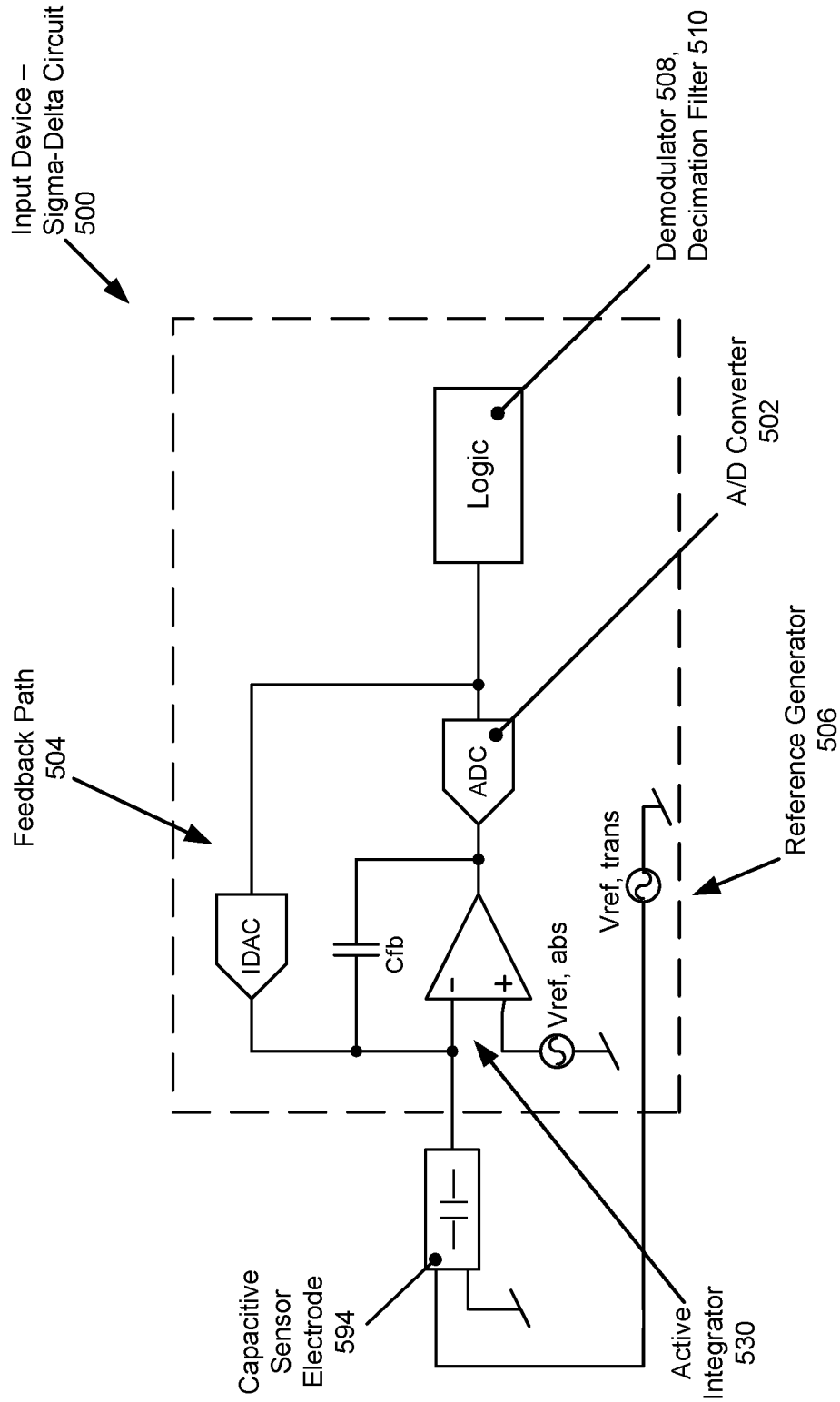
FIG. 5 shows a block diagram of a single-bit sigma-delta configuration for capacitance sensing with an active integrator, in accordance with one or more embodiments.

Turning to FIG. 5, an input device (500) in accordance with one or more embodiments is shown. The input device (500) may correspond to input device (100), discussed above in reference to FIG. 1. Unlike the previously discussed circuits, the circuit shown in FIG. 5 includes an active integrator (530), with the capacitive sensor electrode (594) and the feedback path (504) providing inputs to the active integrator (530). The capacitive sensor electrode (594) may include a background capacitance that may or may not be a result of guarding using a guard voltage, a parasitic capacitance, a finger capacitance, an interference capacitance, and/or resistances, as previously discussed with reference to FIG. 2.

The configuration shown in FIG. 5 further includes a reference generator (506) providing $V_{ref,\ abs}$, and $V_{ref,\ trans}$ to enable simultaneous absolute capacitive and transcapacitive sensing, an A/D converter (502), a demodulator (508) and a decimation filter (510), as previously discussed.

In one or more embodiments, the configuration shown in FIG. 5 may or may not provide quadrature outputs I and Q. Further, similar to the configuration shown in FIG. 4, the demodulators for the absolute capacitance measurement and the transcapacitance measurement may be driven separately by the references $V_{ref,\ abs}$, and $V_{ref,\ trans}$, respectively.

In comparison to the previously introduced circuits, the circuit of FIG. 5 may demonstrate superior noise characteristics by pushing the quantization error that would be near the signal of interest (i.e., near the capacitance measurement(s)) to a higher frequency band near the sampling frequency. To reduce spatial requirements for the circuit, the active integrator may be implemented using a current conveyor. Further, instead of a current feedback, a switched capacitor charge feedback may be used to reduce susceptibility to clock jitter.

Figure 6:
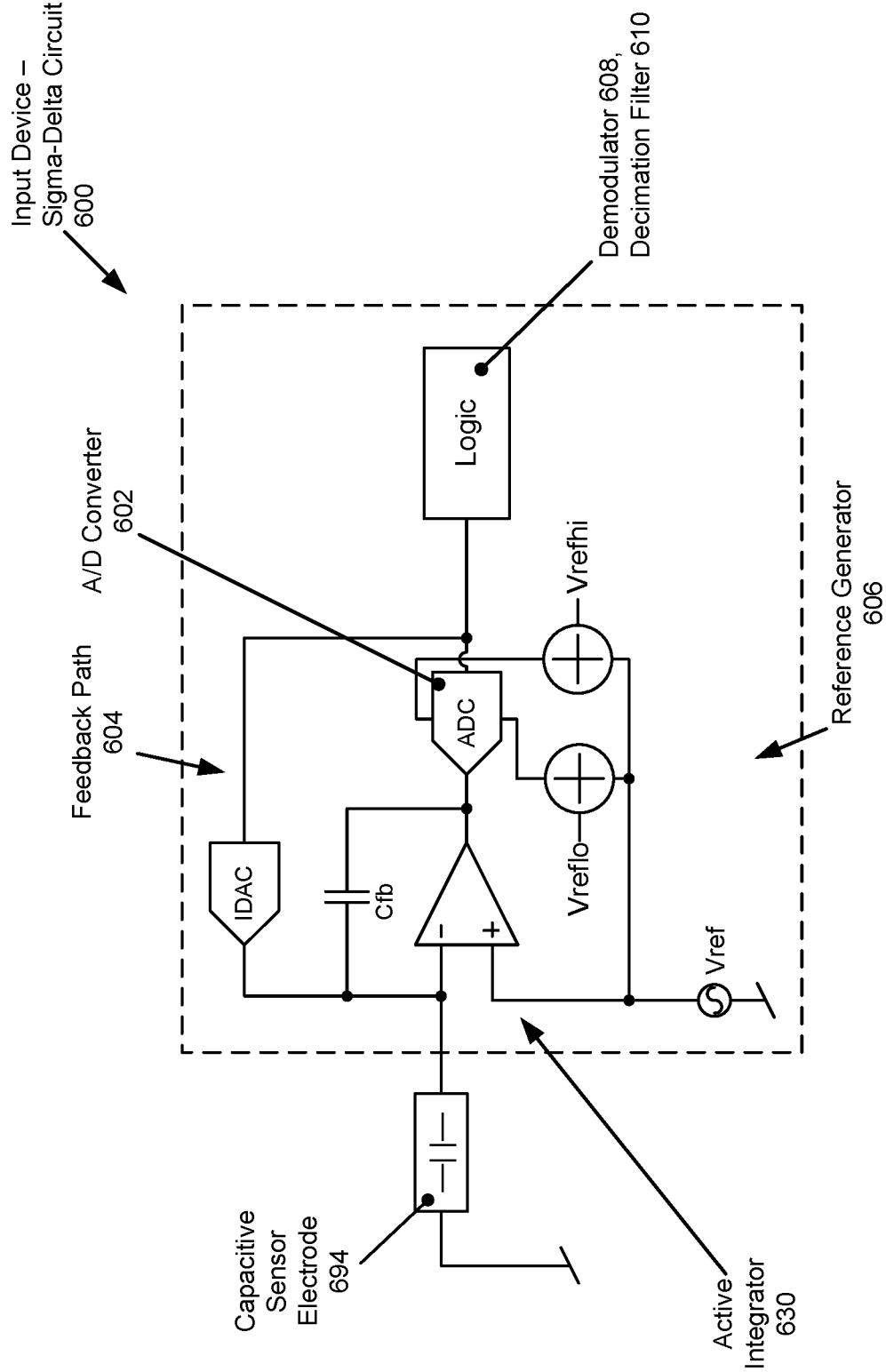
FIG. 6 shows a block diagram of a multi-bit sigma-delta configuration for capacitive sensing, in accordance with one or more embodiments.

Turning to FIG. 6, an input device (600) in accordance with one or more embodiments is shown. Similar to the embodiment shown in FIG. 5, the circuit includes an active integrator (630). Further, similar to the embodiment shown in FIG. 3, the circuit includes an A/D converter (602) and a reference generator (606) with multiple periodic reference signals, $V_{reflo}$, $V_{refhi}$ to control the A/D conversion. The circuit of FIG. 6, thus, combines features of the circuits of FIG. 3 (multiple references) and FIG. 5 (active integrator). However, unlike the embodiment shown in FIG. 5, the embodiment of FIG. 6 features modulation of both the integrator reference and the A/D converter references. A high degree of linearity over a broad range of input capacitances may thus be obtained.

Figure 7:
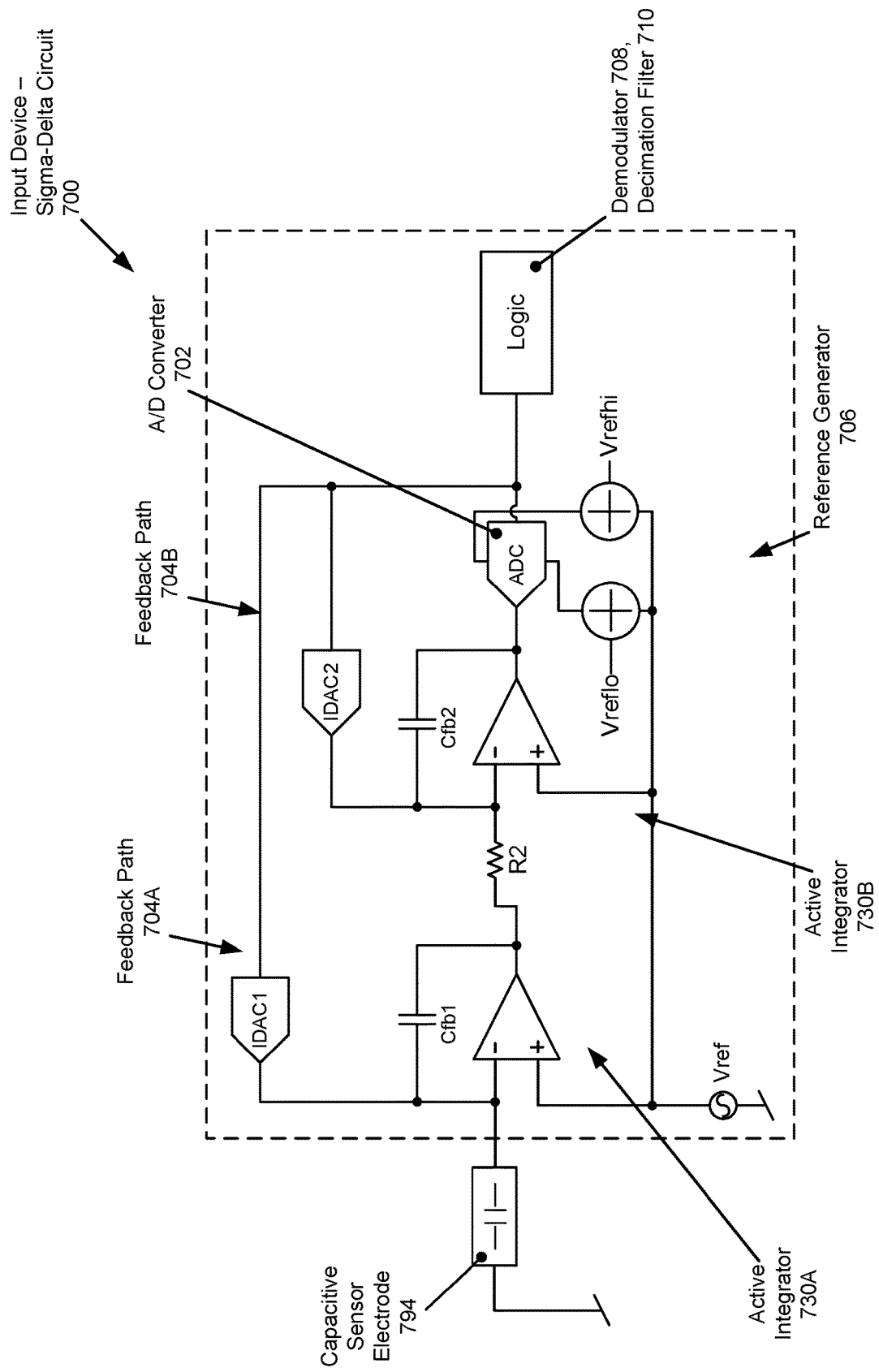
FIG. 7 shows a block diagram of a second order multi-bit sigma-delta in accordance with one or more embodiments.

Turning to FIG. 7, an input device (700) in accordance with one or more embodiments is shown. The input device (700) may be understood as an extension of the input device of FIG. 6. Specifically, the input device (700) includes two active integrators (730A, 730B) in series, with the capacitive sensor electrode (794) being connected to the signal input of the first active integrator (730A). The input device (700) further includes two feedback paths (704A, 704B) from the output of the A/D converter (702) to the signal input of the first and to the signal input of the second active integrator (730A, 730B), respectively. The reference generator in the input device (700) supplies a periodic reference signal to the first and the second active integrators (730A, 730B) and to the A/D converter, which is provided with periodic reference signals with different amplitudes, $V_{reflo}$ and $V_{refhi}$. The demodulator (708) and the decimation filter (710) may operate as described with reference to previously presented embodiments. In one or more embodiments, the use of the additional second active integrator further reduces quantization noise over the low frequency signal band, while increasing noise outside the signal band, at higher frequencies.

While FIGS. 1-7 show configurations of components, other configurations may be used without departing from the scope of the disclosure. For example, various components may be combined to create a single component. As another example, the functionality performed by a single component may be performed by two or more components that may be communicatively connected. In one or more embodiments, a configuration maybe chosen from the embodiments introduced in FIGS. 2-7, based on a desired tradeoff between resolution, bandwidth, circuit complexity, modulator stability, preference for digital vs. analog components, spatial requirements for circuit components, cost, etc. Combinations of these circuits, relying on a comparator or A/D converter with one or more modulated references, may be implemented without departing from the scope of the disclosure. Further, while certain sensing configurations such as absolute capacitance or transcapacitance sensing are illustrated, those skilled in the art will appreciate that none of the embodiments are limited to a specific sensing configuration, i.e., any of the shown sigma-delta configurations may be used for absolute and/or transcapacitance sensing.

Figure 8:
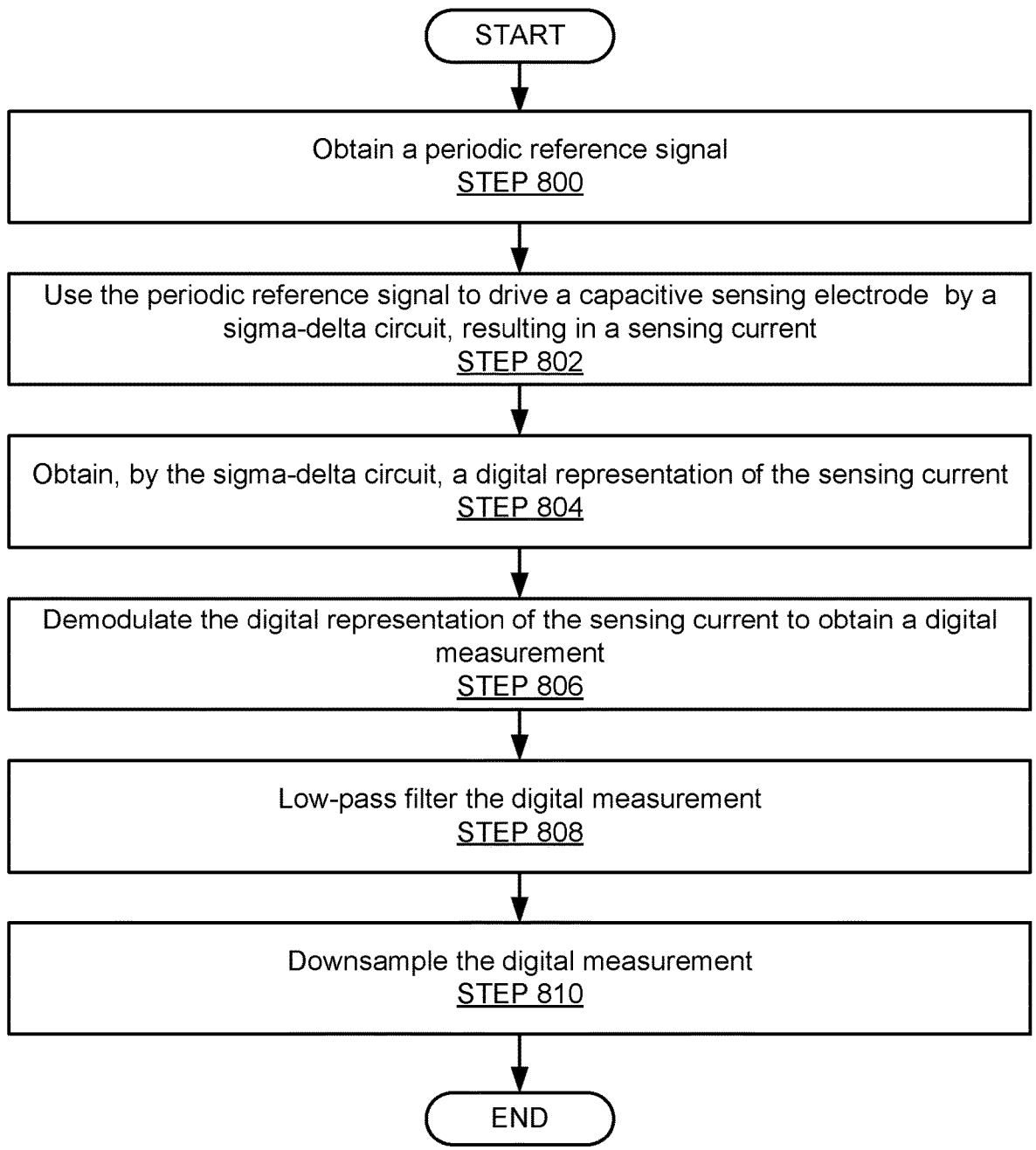
FIG. 8 shows a flowchart in accordance with one or more embodiments.

FIG. 8 shows a flowchart in accordance with one or more embodiments. The flowchart of FIG. 8 depicts a method for operating an input device. One or more of the steps in FIG. 8 may be performed by the components of the input device (200, 300, 400, 500, 600, 700), discussed above in reference to FIGS. 2-7. In one or more embodiments, one or more of the steps shown in FIG. 8 may be omitted, repeated, and/or performed in a different order than the order shown in FIG. 8. Additional steps may further be performed. Accordingly, the scope of the invention should not be considered limited to the specific arrangement of steps shown in FIG. 4A.

Initially, in STEP 800, a periodic reference signal is obtained. The periodic reference signal, $V_{ref}$, may be, for example, a sinusoid, a square wave, or any other periodic waveform. The frequency of $V_{ref}$ may be, for example, 100 kHz, 200 kHz, etc. The periodic reference may be obtained from a numerically controlled oscillator.

In STEP 802, the periodic reference signal is used to drive a capacitive sensor electrode. The driving of the capacitive sensing electrode may be performed by a sigma-delta circuit. The sigma delta circuit may be based on a comparator or analog-to-digital converter and a feedback path from the output of the comparator to the input of the comparator where the capacitive sensor electrode is electrically connected. The periodic reference signal, in accordance with one or more embodiments, serves as the reference for the sigma-delta circuit. The sigma-delta circuit may or may not include one or more active integrators.

In STEP 804, a digital representation of the sensing current is obtained by the sigma-delta circuit. The sigma-delta circuit may translate the sensing current to a one or more bit code that may be directly proportional to the sensing current.

In STEP 806, the digital representation of the sensing current is demodulated to obtain a digital measurement. The demodulation using, e.g., digital multipliers, frequency shifts to near DC the digital representation of the sensing current, thus providing a signal that reflects the capacitance of the capacitive sensor electrode at the input of the sigma-delta converter.

In STEP 808, the output of the demodulator is low pass filtered. The low pass filtering may be performed to avoid aliasing in the subsequently performed STEP 810.

In STEP 810, the output of the low pass filter is downsampled to obtain lower-frequency signals suitable for further processing. The down sampling may be performed by a decimation filter that may include a digital low pass filter, operating on the demodulated signal, and a decimator to obtain output signals of the desired frequency.

One or more embodiments may have various advantages. By modulating the reference voltage(s) of a sigma-delta circuit, the capacitance at the input may be measured. The sigma-delta circuit may provide a low impedance voltage for the capacitance under test and may simultaneously act as the capacitance-evaluating circuit. This configuration may eliminate the need for a separate analog demodulation, filter and ADC chain. Because the circuit in accordance with one or more embodiments is mainly digital, the cost may be low, spatial requirements may be reduced, and integration capacitors and/or current conveyors may be eliminated. Further, because the circuit in accordance with one or more embodiments accommodates a broad spectrum of frequencies, multiple measurements can be performed simultaneously. For example, the absolute capacitance and the transcapacitance may be simultaneously obtained, signals from an active stylus may be picked up, noise may be assessed, etc. Many variations of the circuit may be feasible. For example, quadrature signals may be obtained, measurements may be performed at multiple frequencies, one or more active integrators may or may not be included in the circuit, the comparator may provide single or multiple bit outputs, etc. A specific design may be selected based on application specific requirements, based on tradeoffs between resolution, bandwidth, circuit complexity, modulator stability, preference for digital vs. analog components and/or spatial requirements for circuit components, cost, etc.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An input device, comprising:
   a clocked comparator configured to:
   actively drive a capacitive sensor electrode at a signal input of the clocked comparator with a first periodic reference signal; and
   provide a digital representation of a sensing current resulting from driving the capacitive sensor electrode with the first periodic reference signal,
   wherein the clocked comparator produces the digital representation of the sensing current based on a comparison of the signal input of the clocked comparator with the first periodic reference signal, and
   wherein a feedback path provides negative feedback of the digital representation of the sensing current to the signal input of the clocked comparator; and
   a demodulator configured to demodulate the digital representation of the sensing current using the first periodic reference signal to obtain a first digital measurement.

2. The input device of claim 1, wherein a clock frequency of the clocked comparator is selected to oversample the signal input of the clocked comparator.

3. The input device of claim 1, further comprising:
   a demodulator, a low pass filter, and a decimator configured to down sample the first digital measurement.

4. The input device of claim 3, wherein the demodulator, the low pass filter, and the decimator are implemented as a coefficient generator and a multiplier-accumulator.

5. The input device of claim 1, further comprising:
   a direct digital synthesizer configured to generate the first periodic reference signal.

6. The input device of claim 1, wherein the first digital measurement comprises a quadrature signal.

7. The input device of claim 1, further comprising:
   a second demodulator configured to demodulate the digital representation of the sensing current using a second periodic reference signal to obtain a second digital measurement.

8. The input device of claim 7, wherein the first and the second periodic reference signals are different frequencies.

9. The input device of claim 8,
   wherein the second periodic reference signal is used to drive an electrode in proximity to the capacitive sensor electrode, and
   wherein the second digital measurement reflects a transcapacitance between the capacitive sensor electrode and the electrode in proximity of the capacitive sensor electrode.

10. The input device of claim 8, wherein the second digital measurement is associated with a signal of an active stylus in proximity to the capacitive sensor electrode.

11. The input device of claim 1,
    wherein the clocked comparator is a multi-bit analog-to-digital (A/D) converter, and
    wherein the A/D converter produces the digital representation of the sensing current based on the comparison of the input of the A/D converter with at least a second periodic reference signal, in addition to the first periodic reference signal.

12. An input device, comprising:
    a first active integrator and an analog-to-digital (A/D) converter in series and configured to:
    actively drive a capacitive sensor electrode at a signal input of the active integrator with a periodic reference signal; and
    provide, at an output of the A/D converter, a digital representation of a sensing current resulting from driving the capacitive sensor electrode with the periodic reference signal,
    wherein the periodic reference signal is provided to a reference input of the first active integrator, and
    wherein a feedback path provides negative feedback of the digital representation of the sensing current to the signal input of the active integrator; and
    a demodulator configured to demodulate the digital representation of the sensing current using the periodic reference signal to obtain a digital measurement.

13. The input device of claim 12, wherein the periodic reference signal is further provided as a reference to the A/D converter.

14. The input device of claim 12, further comprising:
a second active integrator between the first active integrator and the A/D converter.

15. A method for operating an input device, comprising:
obtaining a periodic reference signal;
actively driving a capacitive sensor electrode at a signal input of a clocked comparator with the periodic reference signal;
producing, by the clocked comparator, a digital representation of a sensing current based on a comparison of the signal input of the clocked comparator with the periodic reference signal;
providing negative feedback of the digital representation of the sensing current to the signal input of the clocked comparator by a feedback path; and
demodulating the digital representation of the sensing current using the periodic reference signal to obtain a digital measurement.

16. The method of claim 15, further comprising downsampling the digital measurement.

17. The method of claim 15,
wherein the clocked comparator is a component of a sigma-delta circuit, and
wherein the periodic reference signal is a reference input to the sigma-delta circuit.

18. The method of claim 15, wherein the clocked comparator is an analog to digital converter.

19. The method of claim 15, wherein the digital measurement reflects an absolute capacitance of the capacitive sensor electrode.

20. The method of claim 15, wherein the digital measurement comprises a quadrature signal.

* * * * *